United States Patent
Fukuda

(10) Patent No.: US 8,698,580 B2
(45) Date of Patent: Apr. 15, 2014

(54) SURFACE ACOUSTIC WAVE DEVICE AND METHOD FOR MANUFACTURING THE SAME

(75) Inventor: Shinichi Fukuda, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 688 days.

(21) Appl. No.: 12/958,472

(22) Filed: Dec. 2, 2010

(65) Prior Publication Data

US 2011/0102108 A1 May 5, 2011

Related U.S. Application Data

(63) Continuation of application No. PCT/JP2009/002142, filed on May 15, 2009.

(30) Foreign Application Priority Data

Jun. 9, 2008 (JP) .................................. 2008-150389

(51) Int. Cl.
  *H03H 9/64* (2006.01)
  *H03H 9/145* (2006.01)

(52) U.S. Cl.
  USPC ....... 333/193; 333/195; 310/313 B; 29/25.35; 29/594

(58) Field of Classification Search
  USPC .................. 333/193–196; 310/313 B, 313 D; 29/25.35, 594, 609.1, 829, 846
  See application file for complete search history.

(56) References Cited

U.S. PATENT DOCUMENTS

| 5,152,864 A | 10/1992 | Ieki et al. |
|---|---|---|
| 5,929,723 A | 7/1999 | Kimura et al. |
| 6,388,361 B1* | 5/2002 | Nishihara et al. ......... 310/313 R |
| 2002/0008437 A1 | 1/2002 | Inoue et al. |
| 2002/0017837 A1 | 2/2002 | Iwamoto et al. |
| 2003/0132684 A1 | 7/2003 | Nakagawara et al. |
| 2006/0119230 A1* | 6/2006 | Umeda et al. ................. 310/358 |
| 2007/0103038 A1 | 5/2007 | Kamijo |
| 2011/0115334 A1* | 5/2011 | Konishi et al. ............ 310/313 B |

FOREIGN PATENT DOCUMENTS

| JP | 3-14305 A | 1/1991 |
|---|---|---|
| JP | 2002-305425 A | 10/2002 |
| JP | 2003-258594 A | 9/2003 |
| JP | 2005-223809 A | 8/2005 |
| JP | 2007-134932 A | 5/2007 |
| WO | 97/11526 A1 | 3/1997 |
| WO | 00/24123 A1 | 4/2000 |

OTHER PUBLICATIONS

English language machine translation of JP 2005-223809 published Aug. 18, 2005.*
Official Communication issued in International Patent Application No. PCT/JP2009/002142, mailed on Jun. 30, 2009.
Official Communication issued in corresponding Japanese Patent Application No. 2010-516732, mailed on Jun. 12, 2012.

* cited by examiner

*Primary Examiner* — Barbara Summons
(74) *Attorney, Agent, or Firm* — Keating & Bennett, LLP

(57) ABSTRACT

A surface acoustic wave device includes first interconnections and second interconnections connected to a potential different from a potential connected to the first interconnections that are arranged on a piezoelectric substrate. The first interconnections three-dimensionally intersect with the second interconnections with insulating layers made of a thermosetting resin, disposed therebetween. Interdigital electrodes defining IDTs are films which have six-fold rotational symmetric spots appearing in an XRD pole figure and which are defined by Al films or Al—Cu alloy films containing Cu in an amount not greater than the solubility limit at about 25° C.

4 Claims, 5 Drawing Sheets

Cu CONTENT OF 0.5% BY WEIGHT, HEAT
TREATMENT TEMPERATURE OF 305°C
→FORMATION OF HILLOCK STARTS

Cu CONTENT OF 0.5% BY WEIGHT, HEAT
TREATMENT TEMPERATURE OF 275°C
→NO HILLOCK IS FORMED

Cu CONTENT OF 0.2% BY WEIGHT, HEAT
TREATMENT TEMPERATURE OF 305°C
→NO HILLOCK IS FORMED

Cu CONTENT OF 0% BY WEIGHT, HEAT
TREATMENT TEMPERATURE OF 305°C
→NO HILLOCK IS FORMED

Cu CONTENT OF 0.5% BY WEIGHT, HEAT
TREATMENT TEMPERATURE OF 315°C
→HILLOCK IS FORMED

Cu CONTENT OF 0.2% BY WEIGHT, HEAT
TREATMENT TEMPERATURE OF 315°C
→NO HILLOCK IS FORMED

Cu CONTENT OF 0% BY WEIGHT, HEAT
TREATMENT TEMPERATURE OF 315°C
→NO HILLOCK IS FORMED

SURFACE ACOUSTIC WAVE DEVICE AND METHOD FOR MANUFACTURING THE SAME

BACKGROUND OF THE INVENTION

1. Field of the Invention

The present invention relates to surface acoustic wave devices used as, for example, band-pass filters or resonators and methods for manufacturing the surface acoustic wave devices. In particular, the present invention relates to a surface acoustic wave device including a plurality of wiring patterns having different potentials that are arranged on a piezoelectric substrate so as to three-dimensionally intersect with each other with insulating layers disposed therebetween and the present invention also relates to a method for manufacturing such surface acoustic wave devices.

2. Description of the Related Art

Surface acoustic wave devices have been widely used as band-pass filters or resonators. The surface acoustic wave devices are strongly required to have a reduced sized and therefore are likely to have a configuration in which a plurality of wiring patterns having different potentials are arranged on a piezoelectric substrate so as to three-dimensionally intersect with each other with an insulating layer disposed therebetween.

In some applications, the surface acoustic wave devices are required to have high power durability. Japanese Unexamined Patent Application Publication No. 2002-305425 discloses surface acoustic wave devices including electrodes having excellent power durability. With reference to FIG. 10, a surface acoustic wave device 1001 disclosed in Japanese Unexamined Patent Application Publication No. 2002-305425 includes a piezoelectric substrate 1002 made of a $LiNbO_3$ or $LiTaO_3$ single-crystal. In the manufacture thereof, after affected layers are removed from surfaces of the piezoelectric substrate 1002, a base electrode layer 1003 primarily including at least one of Ti and Cr is formed by vacuum vapor deposition. An Al electrode layer 1004 including Al or primarily including Al is then formed. The Al electrode layer 1004 is an epitaxial film having six-fold rotational symmetric spots appearing in an XRD pole figure and has a twin crystal structure. The Al electrode layer 1004 has a crystal orientation in which the crystallographic z-axis of the piezoelectric substrate 1002 substantially coincides with the direction normal to the (111) plane of an Al crystal. Japanese Unexamined Patent Application Publication No. 2002-305425 describes that grain boundaries in the Al electrode layer 1004 are not greater than one interatomic spacing and the self-diffusion of Al through the grain boundaries does not substantially occur. Japanese Unexamined Patent Application Publication No. 2002-305425 also describes that an Al—Cu alloy including a small amount of Cu may be used instead of Al.

The surface acoustic wave device disclosed in Japanese Unexamined Patent Application Publication No. 2002-305425 has increased power durability because of the use of the Al electrode layer 1004 which has the twin crystal structure. The inventors of the present invention have verified that in the case of adding Cu to Al, Al electrode layers having a higher Cu content have higher power durability. Surface acoustic wave devices having a Cu content of 0%, 0.1%, or 1% have been manufactured and have then been tested for power durability in an acceleration mode (power greater than power usually used is applied). FIG. 11 shows the test results. MTTF shown in FIG. 11 refers to a mean time to failure (h). Power is a value that is normalized based on the power that causes a failure of the surface acoustic wave device having a Cu content of 0%. A reduction in loss of 0.3 dB was classified as a failure.

As shown in FIG. 11, an increase in Cu content increases the mean time to failure, which increases the power durability.

For the purpose of size reduction, surface acoustic wave devices are likely to have a configuration in which interconnections connected to different potentials three-dimensionally intersect with each other with an insulating layer disposed therebetween as described above. When a surface acoustic wave device having such a configuration includes an electrode layer that is made of an epitaxial film of an Al—Cu alloy prepared by heavily doping Al with Cu for the purpose of improving power durability and which has a twin crystal structure having six-fold rotational symmetric spots appearing in an XRD pole figure, there is a problem in that hillocks or protrusions are formed on IDT electrodes.

When using a polycrystalline Al—Cu alloy instead of an Al—Cu alloy film made from an epitaxial film having a twin crystal structure having six-fold rotational symmetric spots appearing in an XRD pole figure, hillocks or protrusions are not formed. When using the epitaxial film, which is made of the Al—Cu alloy prepared by heavily doping Al with Cu for the purpose of improving power durability and which has a twin crystal structure, abnormal hillocks or protrusions are likely to be formed on the IDT electrodes during heat curing of the insulating film to form the three dimensionally intersecting portion.

SUMMARY OF THE INVENTION

To overcome the problems described above, preferred embodiments of the present invention provide a surface acoustic wave device which includes a three-dimensional intersecting portion, which enables size reduction, which has improved power durability, and in which abnormal protrusions, such as hillocks, are unlikely to be formed on IDT electrodes, and a method for manufacturing the surface acoustic wave device.

A surface acoustic wave device according to a preferred embodiment of the present invention includes a piezoelectric substrate, IDTs which are arranged on the piezoelectric substrate, each of which includes a pair of interdigital electrodes including a plurality of electrode fingers interdigitated with each other, first interconnections and second interconnections which are arranged on the piezoelectric substrate, which are electrically connected to the IDTs, and which have different potentials, and insulating layers which are arranged on the piezoelectric substrate, which have portions that are located in regions in which the first interconnections three-dimensionally intersect with the second interconnections, which are arranged between the first interconnections and the second interconnections, and which are made of a thermosetting resin. The interdigital electrodes, which define the IDTs, are films which have six-fold rotational symmetric spots appearing in an XRD pole figure, Al films or Al—Cu alloy films including Cu in an amount not greater than the solubility limit at about 25° C., for example.

A material used for the insulating layers is preferably a thermosetting polyimide, for example. In this case, patterning can be readily performed by a photolithographic process.

The curing temperature of the thermosetting resin, which defines the insulating layers, is not particularly limited and is preferably about 305° C. to about 350° C. in a preferred embodiment of the present invention. In this case, the thermosetting resin, such as a polyimide, for example, can be securely cured.

The Al—Cu alloy films preferably have a Cu content in a range of about 0% to about 0.2% by weight, for example. This enables the surface acoustic wave device to have improved power durability. When the Cu content is greater than about 0.2% by weight, hillocks are likely to be formed due to the precipitation of Cu.

In the surface acoustic wave device according to preferred embodiments of the present invention, electrode structures including the IDTs are not particularly limited. In a preferred embodiment of the present invention, the electrode structures preferably define a longitudinally coupled resonator-type surface acoustic wave filter. Therefore, preferred embodiments of the present invention can provide a longitudinally coupled resonator-type surface acoustic wave filter which is suitable for size reduction and which has excellent power durability.

A manufacturing method according to a preferred embodiment of the present invention is used to manufacture a surface acoustic wave device including IDTs which are arranged on a piezoelectric substrate and each of which includes a pair of interdigital electrodes having a plurality of electrode fingers interdigitated with each other, first interconnections and second interconnections which are arranged on the piezoelectric substrate, which are electrically connected to the IDTs, and which have different potentials; and insulating layers which are arranged on the piezoelectric substrate, which have portions that are located in regions in which the first interconnections three-dimensionally intersect with the second interconnections, which are arranged between the first interconnections and the second interconnections, and which are made of a thermosetting resin. The method includes a step of forming the IDTs and the second interconnections on the piezoelectric substrate and a step of providing the thermosetting resin, which forms the insulating layers, on the three-dimensional intersecting portions of the second interconnections and a step of heat curing the thermosetting resin by heating. The interdigital electrodes, which define the IDTs, are films which have six-fold rotational symmetric spots appearing in an XRD pole figure, Al films or Al—Cu alloy films including Cu in an amount not greater than the solubility limit at 25° C., for example.

In a preferred embodiment of the manufacturing method of the surface acoustic wave device according to the present invention, the thermosetting resin is preferably heated at a temperature of about 305° C. to about 350° C., for example, in order to cure the thermosetting resin by heating. In this case, the thermosetting resin, such as a polyimide, for example, can be securely cured.

In another preferred embodiment of the manufacturing method of the surface acoustic wave device according to the present invention, the Al—Cu alloy films preferably have a Cu content in a range of about 0% to about 0.2% by weight, for example.

In a surface acoustic wave device according to various preferred embodiment of the present invention, interdigital electrodes defining the IDTs are films which have six-fold rotational symmetric spots appearing in an XRD pole figure, Al films or Al—Cu alloy films including Cu in an amount not greater than the solubility limit at about 25° C., for example. This enables the surface acoustic wave device to have improved power durability. Furthermore, lines connected to different potentials three-dimensionally intersect with each other with insulating layers disposed therebetween. Thus, the surface acoustic wave device is suitable for size reduction. In addition, hillocks are not formed on interdigital electrodes including the Al films or the Al—Cu alloy films even if the interdigital electrodes are heated in order to cure a resin forming the insulating layers.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the accompanying drawings.

Figure 1:
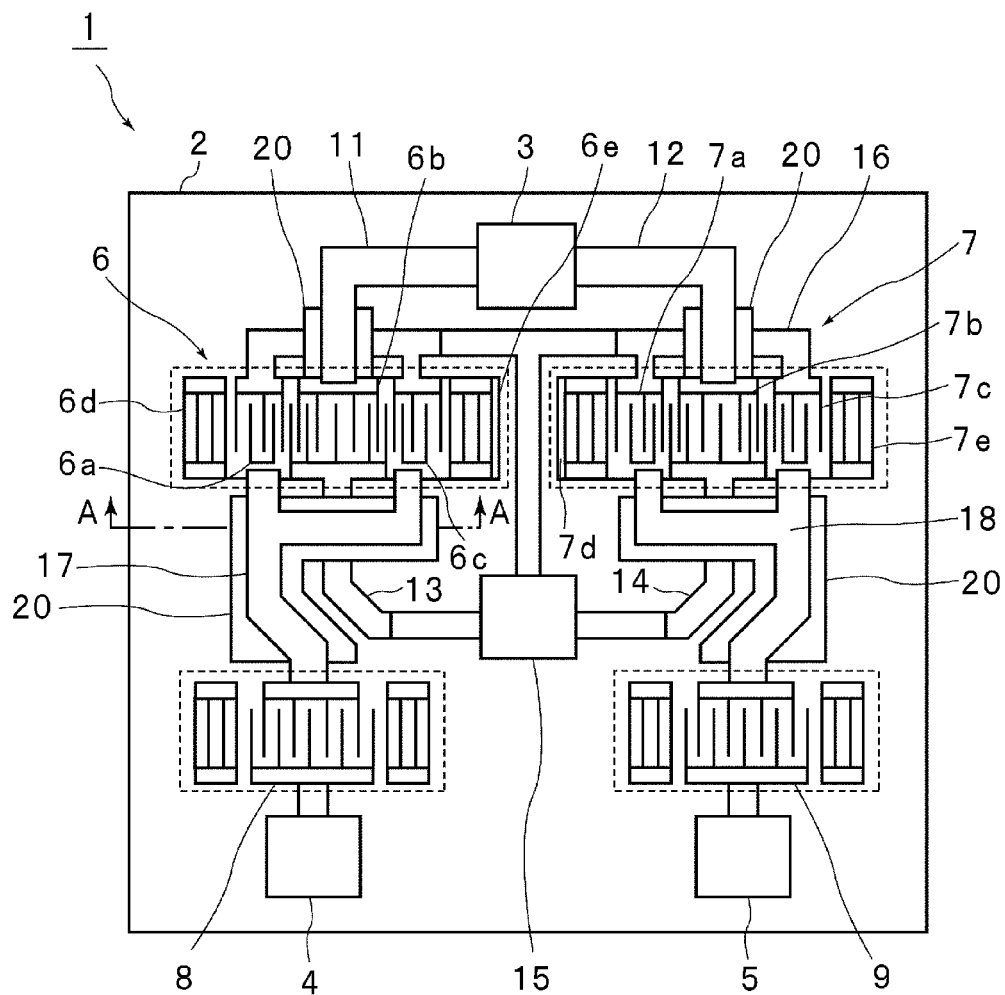
FIG. 1 is a schematic plan view of a surface acoustic wave device according to a preferred embodiment of the present invention.
Figure 2:
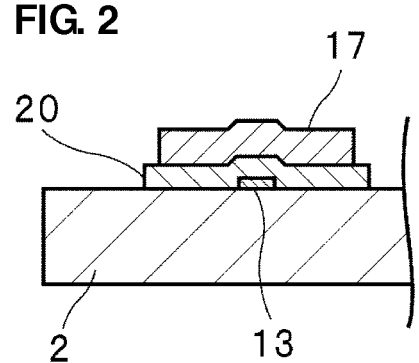
FIG. 2 is a partial cutaway enlarged front sectional view taken along the line A-A of FIG. 1.

FIG. 1 is a schematic plan view of a surface acoustic wave device according to a preferred embodiment of the present invention. FIG. 2 is a partial cutaway enlarged front sectional view illustrating a three-dimensional intersecting portion of the surface acoustic wave device.

With reference to FIG. 1, the surface acoustic wave device 1 includes a piezoelectric substrate 2. In this preferred embodiment, the piezoelectric substrate 2 is preferably made of a LiTaO$_3$ single-crystal, for example. The piezoelectric substrate 2 may be made from another piezoelectric single-crystal such as a LiNbO$_3$ single-crystal or a quartz crystal or may be made of a piezoelectric ceramic, for example.

An electrode structure is disposed on the upper surface of the piezoelectric substrate 2 as shown in FIG. 1. The surface acoustic wave device 1 is a surface acoustic wave filter device having a balance-unbalance conversion function. An electrode pad defining an unbalanced terminal 3 is disposed on the piezoelectric substrate 2. Electrode pads each defining a first balanced terminal 4 or a second balanced terminal 5 are also disposed on the piezoelectric substrate 2.

The unbalanced terminal 3 is electrically connected to a first longitudinally coupled resonator-type surface acoustic wave filter portion 6 and a second longitudinally coupled resonator-type surface acoustic wave filter portion 7. The latter stage of the first longitudinally coupled resonator-type surface acoustic wave filter portion 6 and the latter stage of the second longitudinally coupled resonator-type surface acoustic wave filter portion 7 are electrically connected to a one-port-type surface acoustic wave resonator 8 and a one-port-type surface acoustic wave resonator 9, respectively. The one-port-type surface acoustic wave resonator 8 and the one-port-type surface acoustic wave resonator 9 are connected to the first balanced terminal 4 and the second balanced terminal 5, respectively.

In particular, the first longitudinally coupled resonator-type surface acoustic wave filter portion 6 and the second longitudinally coupled resonator-type surface acoustic wave filter portion 7 preferably include three IDTs 6a to 6c and three IDTs 7a to 7c, respectively, for example, arranged in the propagation direction of a surface acoustic wave. The first longitudinally coupled resonator-type surface acoustic wave filter portion 6 and the second longitudinally coupled resonator-type surface acoustic wave filter portion 7 preferably include a pair of reflectors 6d and 6e and a pair of reflectors 7d and 7e, respectively.

One end of the second IDT 6b of the first longitudinally coupled resonator-type surface acoustic wave filter portion 6 and one end of the second IDT 7b of the second longitudinally coupled resonator-type surface acoustic wave filter portion 7 are electrically connected to the unbalanced terminal 3 through a first interconnection 11 and a first interconnection 12, respectively. The other end of the second IDT 6b and the other end of the second IDT 7b are electrically connected to an earth terminal 15 through a second interconnection 13 and a second interconnection 14, respectively, the ground terminal 15 being an electrode pad connected to the ground potential. One end of each of the first IDT 6a, the third IDT 6c, the first IDT 7a, and the third IDT 7c are commonly connected through a second interconnection 16. The second interconnection 16 is electrically connected to the ground terminal 15.

The other ends of the first IDTs 6a and 6c are connected to the one-port-type surface acoustic wave resonator 8 through a first interconnection 17. The one-port-type surface acoustic wave resonator 8 is connected to the first balanced terminal 4. Likewise, the other ends of the first and third IDTs 7a and 7c of the second longitudinally coupled resonator-type surface acoustic wave filter portion 7 are commonly connected through a first interconnection 18 and are connected to the one-port-type surface acoustic wave resonator 9. The one-port-type surface acoustic wave resonator 9 is connected to the second balanced terminal 5.

The first interconnections three-dimensionally intersect with the second interconnections with insulating layers 20 disposed therebetween. In a three-dimensional intersecting portion, two interconnections connected to different potentials intersect. One of the two interconnections that is disposed on the piezoelectric substrate side is herein referred to as a second interconnection and the other one that is disposed on one of the insulating layers 20 is herein referred to as a first interconnection.

FIG. 2 is a partial enlarged front sectional view taken along the line A-A of FIG. 1. In a three-dimensional intersecting portion shown in FIG. 2, one of the insulating layers 20 is disposed on the second interconnection 13 and the first interconnection 17 is disposed on the insulating layer 20.

The use of such a three-dimensional intersecting portion enables interconnections to be densely arranged in the surface acoustic wave device 1 and allows the surface acoustic wave device 1 to have a reduced size.

A heat-curable resin, for example, is preferably used as a material for the insulating layers 20. Examples of the thermosetting resin include thermosetting polyimides, epoxy resins, and other appropriate thermosetting resins. A thermosetting polyimide, for example, is preferably used herein because the thermosetting polyimide can be readily patterned by a photolithographic process. The thermosetting polyimide preferably has a curing temperature of about 305° C. or greater. Therefore, in order to heat-cure the thermosetting polyimide, the thermosetting polyimide must be heated to about 305° C. or greater.

In this preferred embodiment, interdigital electrodes defining the IDTs 6a to 6c and 7a to 7c are epitaxial films having six-fold rotational symmetric spots appearing in an XRD pole figure, and Al films or Al—Cu alloy films which include Cu in an amount not greater than the solubility limit at 25° C. This prevents hillocks from being formed on the IDTs 6a to 6c and 7a and 7c even though a step of heat-curing the insulating layers 20, which is made of the heat-curable resin, is performed. This is described below in detail based on experiments.

In this preferred embodiment, the IDTs 6a to 6c and 7a to 7c preferably include the Al films or Al—Cu alloy films specified above, for example. In this preferred embodiment, the reflectors 6d, 6e, 7d, and 7e, an electrode material defining the one-port-type surface acoustic wave resonators 8 and 9, and the interconnections 11 to 14, 16, 17, 18 are preferably made of the same material, for example. This reduces the number of electrode materials used to manufacture the surface acoustic wave device 1 and also simplifies an electrode-forming step. A material forming electrode pads other than the IDTs 6a to 6c and 7a to 7c, electrodes, or interconnections may be made of another metal.

The formation of hillocks is also preferably prevented for members other than the IDTs. Therefore, in this preferred embodiment, electrodes defining the reflectors 6d, 6e, 7d, and 7e and the surface acoustic wave resonators 8 and 9 preferably include the Al films or Al—Cu alloy films specified above, for example.

Figure 9:
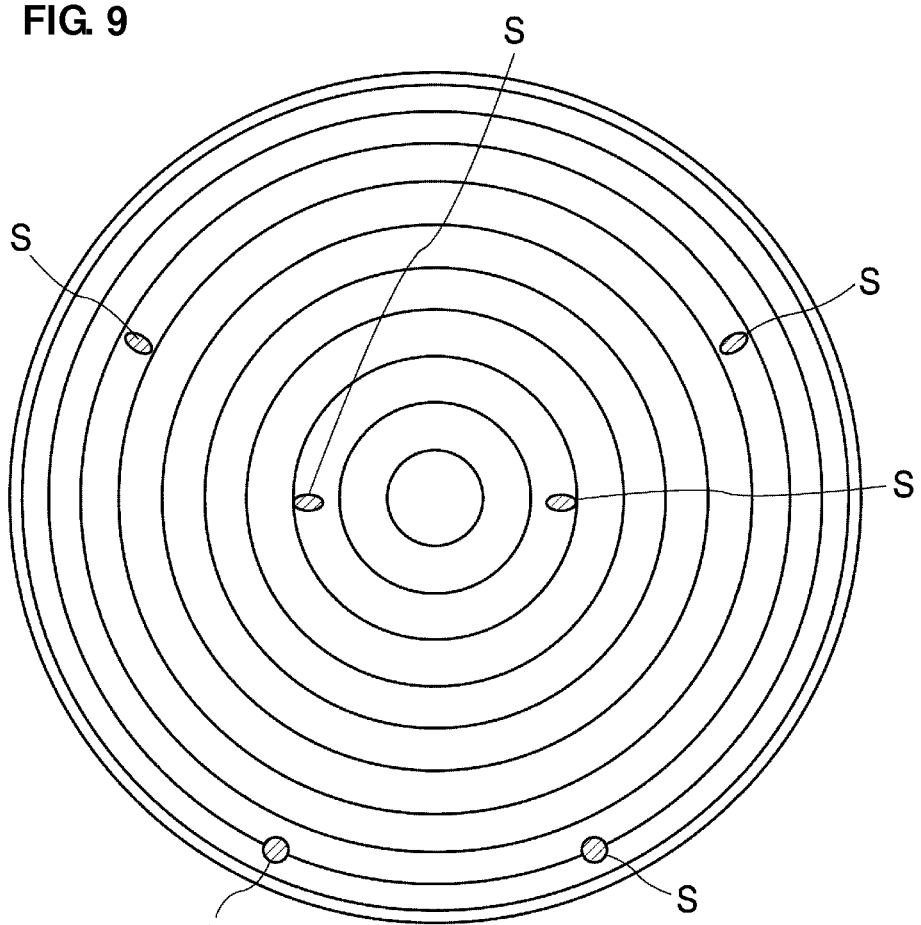
FIG. 9 is an illustration showing a state in which six-fold rotational symmetric spots appear in an Al (200) incident pole figure in an XRD spectrum.
Figure 10:
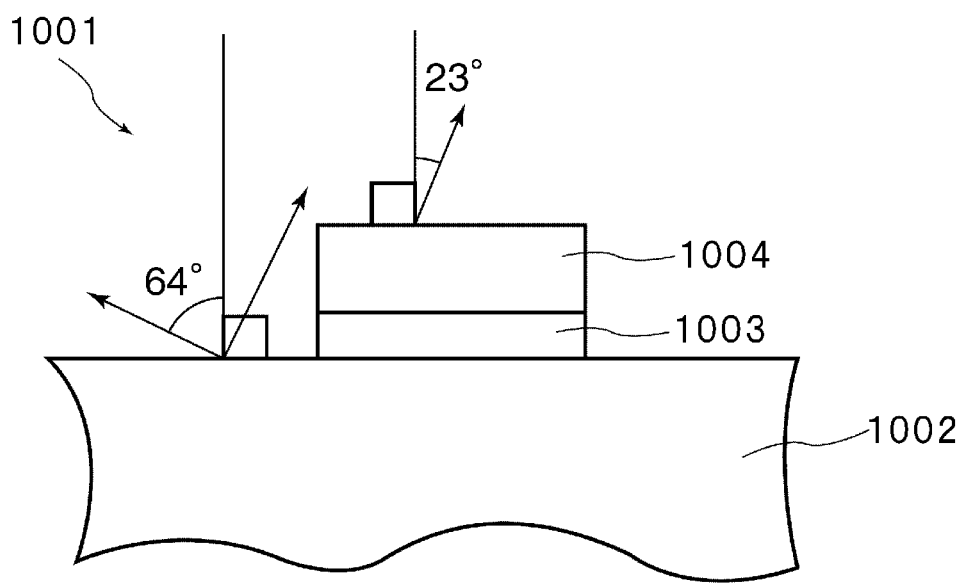
FIG. 10 is a schematic view illustrating a conventional surface acoustic wave device.
Figure 11:
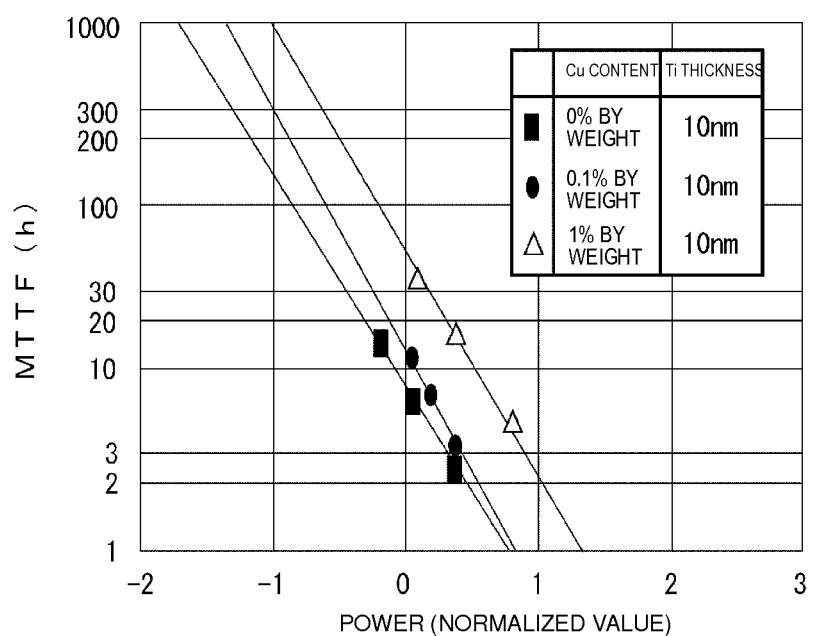
FIG. 11 is a graph showing the results of an acceleration test for measuring the lifetime of surface acoustic wave devices.

FIG. 9 is a schematic view showing six-fold rotational symmetric spots of an Al—Cu film in which the six-fold rotational symmetric spots appear in an XRD pole figure.

As described above, when using the Al—Cu alloy film that is the epitaxial film having the twin crystal structure having the six-fold rotational symmetric spots appearing in the XRD pole figure, the structure including the insulating layer made of the thermosetting resin has a problem in that the hillocks are formed on the interdigital electrodes during a heating step of forming the insulating layer. The inventors have investigated the hillocks and have discovered that the hillocks formed on the Al—Cu alloy film are made of Cu. As a result of various investigations, the inventors have discovered that the following films are preferably used for the interdigital electrodes: epitaxial films having six-fold rotational symmetric spots appearing in an XRD pole figure, Al films or Al—Cu alloy films which include Cu in an amount not greater than the solubility limit at about 25° C.

This is described below in detail together with a manufacturing method based on experiments.

The surface acoustic wave device 1 was manufactured by the following process.

For the manufacture of the surface acoustic wave device 1, the piezoelectric substrate 2 was prepared from $LiTaO_3$. The unbalanced terminal 3, the first and second balanced terminals 4 and 5, the ground terminal 15, the IDTs 6a to 6c of the first longitudinally coupled resonator-type surface acoustic wave filter portion 6, the IDTs 7a to 7c of the second longitudinally coupled resonator-type surface acoustic wave filter portion 7, the reflectors 6d, 6e, 7d, and 7e, IDTs and reflectors of the one-port-type surface acoustic wave resonators 8 and 9, and the second interconnections 13, 14, and 16 were formed on the piezoelectric substrate 2 as shown in FIG. 1. During the formation of the IDTs, reflectors, and second interconnections, a Ti film with a thickness of about 10 nm was formed on the upper surface of the piezoelectric substrate 2 and an Al film that was a twin crystal epitaxial film with a thickness of about 130 nm was formed on the Ti film. The Ti film and the Al film were formed by vacuum vapor deposition.

In order to form three-dimensional intersecting portions, thermosetting polyimide layers with a thickness of about 3 μm were formed on regions defining the three-dimensional intersecting portions.

In order to cure the thermosetting polyimide layers, the entire the surface acoustic wave device 1 was heated at a temperature of about 305° C. In this manner, the thermosetting polyimide layers were cured, whereby the insulating layers 20 were formed.

For the first interconnections 11, 12, 17, and 18, a Ti film with a thickness of about 200 nm was formed over the thermosetting polyimide layers and the upper surface of the piezoelectric substrate 2 and an Al film with a thickness of about 1000 nm was then formed on this Ti film.

In the surface acoustic wave device 1, the IDTs 6a to 6c and 7a to 7c were examined with a field emission scanning electron microscope (FE-SEM), and no hillocks were observed.

Surface acoustic wave devices 1 were manufactured by the same procedure as described above except that Al—Cu films which had a Cu content of about 0.2% or about 0.5% by weight and which were epitaxial films having a twin crystal structure were used to form IDTs and reflectors instead of the above Al films and insulating layers 20 were formed by heat-curing at a temperature of about 275° C., about 305° C., or about 315° C. The surface acoustic wave devices 1 manufactured as described above were each examined with a field emission scanning electron microscope and the presence of hillocks was observed.

The results are shown in FIGS. 3A to 8. Cu contents and heat treatment temperatures shown in FIGS. 3A to 8 are as shown in Table 1 below.

TABLE 1

Figure 3A:
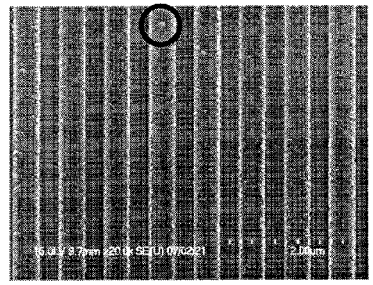
FIG. 3A is an electron micrograph showing the formation of a hillock in the case of a Cu content of about 0.5% by weight and a heat treatment temperature of about 305° C.
Figure 3B:
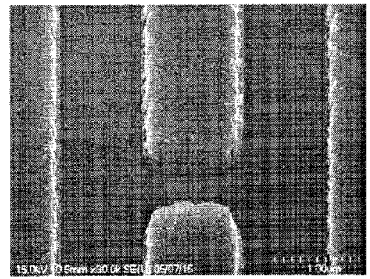
FIG. 3B is an electron micrograph showing the state of an IDT formed in the case of a Cu content of about 0.5% by weight and a heat treatment temperature of about 275° C.
Figure 4:
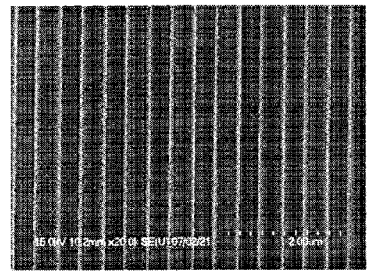
FIG. 4 is an electron micrograph showing the formation of a hillock in the case of a Cu content of about 0.2% by weight and a heat treatment temperature of about 305° C.
Figure 5:
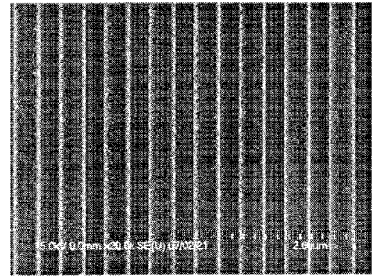
FIG. 5 is an electron micrograph showing the formation of a hillock in the case of a Cu content of about 0% by weight, that is, an Al film, and a heat treatment temperature of about 305° C.

| | | Cu contents (weight percent) | | |
|---|---|---|---|---|
| | | 0.5 | 0.2 | 0 |
| Heat treatment temperatures (° C.) | 275 | FIG. 3B No hillock was formed. | No sample was prepared. | No sample was prepared. |
| | 305 | FIG. 3A The formation of a hillock starts. | FIG. 4 No hillock was formed. | FIG. 5 No hillock was formed. |

TABLE 1-continued

Figure 6A:
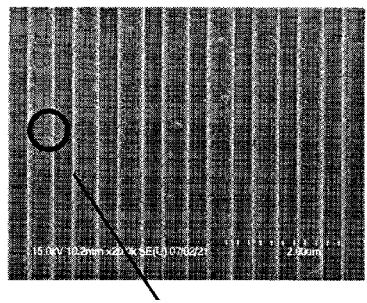
FIG. 6A is an electron micrograph showing the formation of a hillock in the case of a Cu content of about 0.5% by weight and a heat treatment temperature of about 315° C.
Figure 6B:
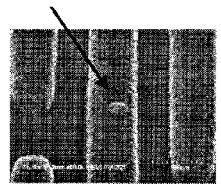
FIG. 6B is an electron micrograph showing an enlarged portion thereof.
Figure 7:
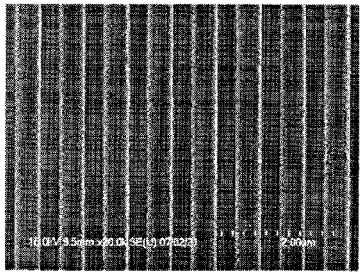
FIG. 7 is an electron micrograph showing the formation of a hillock in the case of a Cu content of about 0.2% by weight and a heat treatment temperature of about 315° C.
Figure 8:
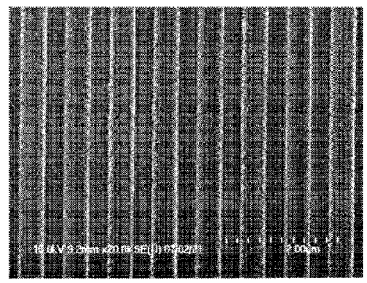
FIG. 8 is an electron micrograph showing the formation of a hillock in the case of a Cu content of about 0% by weight, that is, an Al film, and a heat treatment temperature of about 315° C.

| | | Cu contents (weight percent) | | |
|---|---|---|---|---|
| | | 0.5 | 0.2 | 0 |
| | 315 | FIG. 6A and 6B Hillocks were formed. | FIG. 7 No hillock was formed. | FIG. 8 No hillock was formed. |

The result shown in FIG. 5 corresponds to the result of an example in which a Cu content of about 0% by weight and a heat treatment temperature of about 315° C., and in which no hillocks were observed as described above. As shown in FIG. 8, in the case of a Cu content of about 0% by weight, that is, in the case of using Al films, no hillocks were observed although the heat treatment temperature was increased to about 305° C.

As is clear from a comparison between FIGS. 3A and 3B, no hillocks were observed when a Cu content was about 0.5% by weight and a heating temperature was about 275° C., but hillocks were observed when a Cu content was about 0.5% by weight and a heating temperature was about 305° C. As shown in FIG. 6A, hillocks were observed when a Cu content was about 0.5% by weight and a heat treatment temperature was about 315° C. These hillocks were relatively large as shown in FIG. 6B. Therefore, it is clear that the heat treatment temperature cannot be increased to about 305° C. or greater when a Cu content is about 0.5% by weight.

As shown in FIGS. 4 and 7, when a Cu content was about 0.2% by weight and a heat treatment temperature was about 305° C. or about 315° C., no hillocks were observed.

Therefore, it is clear that in order to prevent the formation of hillocks, the Al films or the Al—Cu alloy films having a Cu content of about 0.2% by weight need only to be used. That is, the formation of such hillocks is prevented in such a manner that Al—Cu alloy films that are epitaxial films having a twin crystal structure are used and the content of Cu, which improves the power durability, therein is adjusted to a desired value or less.

As described above, when using the polycrystalline Al—Cu alloy films, no hillocks were formed. However, when using the Al—Cu alloy films which have the twin crystal structure and which are the epitaxial films having six-fold rotational symmetric spots appearing in an XRD pole figure, the hillocks were formed. A reduction in Cu content prevents the formation of the hillocks. The reason for this is believed to be as follows.

In the Al—Cu alloy films having the twin crystal structure, heat energy is dissipated by the interdiffusion of Al and Cu at grain boundaries because Al atoms are confined in crystal lattices and, therefore, do not migrate in crystal domains.

The reason that no hillocks were formed even though the conventional polycrystalline Al—Cu alloy films were heated is believed to be because since crystal boundaries have a large volume, Cu forms solid solutions in the crystal boundaries so as to prevent the formation of hillocks. In contrast, the Al—Cu alloy films which have the twin crystal structure and which are the epitaxial films have grain boundaries located at the boundaries between twin crystal domains. These grain boundaries are as small as one interatomic spacing or less and, therefore, there is no space for Cu to form solid solutions in these grain boundaries. Thus, Cu precipitates, which is believed to cause the growth of hillocks.

The precipitation of Cu due to heat treatment is suppressed such that the content of Cu is preferably limited to about 0.2% by weight, for example, which is the solubility limit at room temperature (about 25° C.), whereby the growth of the hillocks can be prevented.

In preferred embodiments of the present invention, Al films or Al—Cu alloy films which include Cu in an amount not greater than the solubility limit at about 25° C. are preferably used, for example, the Al films or Al—Cu alloy films being epitaxial films having six-fold rotational symmetric spots appearing in an XRD pole figure. This effectively prevents the formation of the hillocks. Thus, a surface acoustic wave device having stable properties is provided. The use of the Al films or Al—Cu alloy films is effective to improve power durability.

In the preferred embodiments described above, the surface acoustic wave filter, shown in FIG. 1, having the balance-unbalance conversion function is preferably provided. Preferred embodiments of the present invention are not limited to the surface acoustic wave filter and are widely applicable to surface acoustic wave filters having other circuit configurations and surface acoustic wave devices including surface acoustic wave elements such as resonators and delay lines.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a piezoelectric substrate;
   a plurality of IDTs arranged on the piezoelectric substrate, each of which includes a pair of interdigital electrodes including a plurality of electrode fingers interdigitated with each other;
   a plurality of first interconnections and a plurality of second interconnections arranged on the piezoelectric substrate, electrically connected to the IDTs, and having potential differences; and
   a plurality of insulating layers arranged on the piezoelectric substrate, including portions that are located in regions in which the plurality of first interconnections three-dimensionally intersect with the plurality of second interconnections, the plurality of insulating layers being arranged between the plurality of first interconnections and the plurality of second interconnections and being made of a thermosetting resin; wherein
   the pair of interdigital electrodes of each of the plurality of IDTs are films which have six-fold rotational symmetric spots appearing in an XRD pole figure, and which are defined Al—Cu alloy films including Cu in an amount not greater than a solubility limit at about 25° C.;
   the thermosetting resin has a curing temperature of about 305° C. to about 350° C.; and
   the Al—Cu alloy films have a Cu content of about 0% to about 0.2% by weight.

2. The surface acoustic wave device according to claim 1, wherein the insulating layers are made of a thermosetting polyimide.

3. The surface acoustic wave device according to claim 1, further comprising electrode structures including the plurality of IDTs and being arranged on the piezoelectric substrate, wherein the electrode structures define a longitudinally coupled resonator surface acoustic wave filter.

4. A method for manufacturing a surface acoustic wave device including a plurality of IDTs which are arranged on a piezoelectric substrate and each of which includes a pair of interdigital electrodes including a plurality of electrode fingers interdigitated with each other, a plurality of first interconnections and a plurality of second interconnections which are arranged on the piezoelectric substrate, which are electrically connected to the plurality of IDTs, and which have different potentials, and a plurality of insulating layers which are arranged on the piezoelectric substrate, which have portions that are located in regions in which the plurality of first interconnections three-dimensionally intersect with the plurality of second interconnections and that are arranged between the plurality of first interconnections and the plurality of second interconnections, and which are made of a heat-curable resin, the method comprising:
   a step of forming the plurality of IDTs and the plurality of second interconnections on the piezoelectric substrate; and
   a step of providing the heat-curable resin on the three-dimensional intersecting portions of the first and second interconnections; and
   a step of heat curing the thermosetting resin by heating the thermosetting resin at a temperature of about 305° C. to about 350° C.; wherein
   the pair of interdigital electrodes of each of the plurality of IDTs are films which have six-fold rotational symmetric spots appearing in an XRD pole figure, and which are defined by Al—Cu alloy films including Cu in an amount not greater than the solubility limit at about 25° C.; and
   the Al—Cu alloy films have a Cu content of about 0% to about 0.2% by weight.

* * * * *